(12) United States Patent
Boiselle (10) Patent No.: US 12,538,434 B2
(45) Date of Patent: Jan. 27, 2026

(54) FLATTENING A CIRCUIT BOARD ASSEMBLY USING VACUUM PRESSURE

(71) Applicant: Teradyne, Inc., North Reading, MA (US)

(72) Inventor: Eric Boiselle, Lynnfield, MA (US)

(73) Assignee: Teradyne, Inc., North Reading, MA (US)

( * ) Notice: Subject to any disclaimer, the term of this patent is extended or adjusted under 35 U.S.C. 154(b) by 690 days.

(21) Appl. No.: 17/747,095

(22) Filed: May 18, 2022

(65) Prior Publication Data

US 2023/0380073 A1    Nov. 23, 2023

(51) Int. Cl.
*H05K 3/22* (2006.01)

(52) U.S. Cl.
CPC ....... *H05K 3/225* (2013.01); *H05K 2203/085* (2013.01); *H05K 2203/1121* (2013.01)

(58) Field of Classification Search
CPC ............. H05K 3/225; H05K 2203/085; H05K 2203/1121; H05K 13/0069; H05K 1/0203; H05K 3/0061
See application file for complete search history.

(56) References Cited

U.S. PATENT DOCUMENTS

| | | | | |
|---|---|---|---|---|
| 4,700,474 A | * | 10/1987 | Choinski | H05K 3/0094 156/247 |
| 4,748,742 A | * | 6/1988 | Choinski | H05K 3/0094 156/247 |
| 4,777,721 A | * | 10/1988 | Choinski | H05K 3/0094 156/247 |
| 5,054,193 A | * | 10/1991 | Ohms | H05K 3/3415 29/760 |
| 5,819,394 A | * | 10/1998 | Curtin | B29C 39/10 29/760 |
| 7,775,785 B2 | | 8/2010 | McCutcheon et al. | |

(Continued)

FOREIGN PATENT DOCUMENTS

| | | |
|---|---|---|
| CN | 104244600 A | 12/2014 |
| CN | 204382423 U | 5/2015 |

(Continued)

OTHER PUBLICATIONS

International Preliminary Report on Patentability received for PCT Patent Application No. PCT/US2023/021999, mailed on Nov. 7, 2024, 5 pages.

(Continued)

*Primary Examiner* — Jeffrey T Carley
*Assistant Examiner* — Jose K Abraham
(74) *Attorney, Agent, or Firm* — ArentFox Schiff LLP (57) ABSTRACT

An example method of flattening a circuit board assembly includes attaching the circuit board assembly to a structure having dimensions that partly enclose a space, where attachment of the circuit board assembly to the structure creates an air-tight seal over the space, and where the structure has at least one port in fluid communication with the space. The method also includes applying vacuum pressure to the space via the at least one port, where the vacuum pressure forces at least part of the circuit board assembly toward the space, and dispensing thermal interface material selectively onto parts of the circuit board assembly while the vacuum pressure is applied.

23 Claims, 11 Drawing Sheets

(56) References Cited

U.S. PATENT DOCUMENTS

| | | | |
|---|---|---|---|
| 9,012,262 B2 | 4/2015 | George et al. | |
| 9,136,159 B2 | 9/2015 | Kelly et al. | |
| 9,661,745 B1 * | 5/2017 | Yazzie | H04N 23/51 |
| 9,776,376 B2 | 10/2017 | Swartz et al. | |
| 10,283,400 B1 | 5/2019 | Kelly et al. | |
| 12,127,334 B2 | 10/2024 | Too et al. | |
| 2011/0026226 A1 * | 2/2011 | Zheng | H05K 7/209 |
| | | | 361/709 |
| 2012/0250260 A1 * | 10/2012 | Burton | G06F 1/181 |
| | | | 361/720 |
| 2014/0035084 A1 | 2/2014 | Farrier et al. | |
| 2015/0231825 A1 | 8/2015 | Swartz et al. | |
| 2015/0271962 A1 | 9/2015 | Moncavage | |
| 2015/0342069 A1 * | 11/2015 | Foong | H05K 3/303 |
| | | | 29/831 |
| 2022/0087084 A1 * | 3/2022 | Tudman | H05K 13/0469 |

FOREIGN PATENT DOCUMENTS

| | | | | |
|---|---|---|---|---|
| JP | 2008270591 A | * | 11/2008 | H01L 24/75 |
| KR | 1020090091205 A | | 8/2009 | |
| TW | 463535 B | * | 11/2001 | H05K 13/0069 |
| TW | 201018839 A | * | 5/2010 | |
| WO | WO-2009003411 A1 | * | 1/2009 | H04M 1/0277 |

OTHER PUBLICATIONS

"Z1800-Series-Fixturing Guide", Teradyne, Inc., 2000, 141 pages.
"Z1800-Series-Operator's Guide", Teradyne, Inc., 1998, 117 pages.
International Search Report and Written Opinion in Application No. PCT/US2023/021999 dated Aug. 30, 2023, 10 pages.

* cited by examiner

FLATTENING A CIRCUIT BOARD ASSEMBLY USING VACUUM PRESSURE

TECHNICAL FIELD

This specification describes examples of systems for flattening a circuit board assembly using vacuum pressure.

BACKGROUND

A circuit board assembly may bow or bend during a manufacturing process. For example, the center or middle of the circuit board assembly may be elevated above all or parts of sides of the circuit board assembly. This bowing or bending can have an adverse effect on operations performed during manufacturing processes that involve the circuit board assembly.

SUMMARY

An example method of flattening a circuit board assembly includes attaching the circuit board assembly to a structure having dimensions that partly enclose a space, where attachment of the circuit board assembly to the structure creates an air-tight seal over the space, and where the structure has at least one port in fluid communication with the space. The method also includes applying vacuum pressure to the space via the at least one port, where the vacuum pressure forces at least part of the circuit board assembly toward the space, and dispensing thermal interface material selectively onto parts of the circuit board assembly while the vacuum pressure is applied. The method may include one or more of the following features, either alone or in combination.

The parts of the circuit board assembly may include components on a surface of the circuit board assembly. The thermal interface material may be dispensed onto surfaces of the components. Applying vacuum pressure may reduce, in a vertical dimension, deviations in height of a stack comprising the circuit board assembly and the structure. The thermal interface material may not, in some examples, be dispensed onto all or some regions of the circuit board assembly that do not include the components.

Absent vacuum, the circuit board assembly bows, at least in part, relative to the structure. The vacuum pressure may be applied at sufficient magnitude and for a sufficient duration to reduce, or to eliminate, bowing of the circuit board assembly relative to the structure. The vacuum pressure may be applied at sufficient magnitude and for a sufficient duration to cause the circuit board assembly to become flat.

The structure may include a gasket that creates the air-tight seal over the space between the circuit board assembly and the structure. The structure may include ribs within the space. Locations of the ribs may correspond to locations of the circuit board assembly that do not include components. The ribs may be configured to allow fluid communication with the at least one port throughout the space.

The structure may include alignment pins. Attaching the circuit board assembly to the structure may include aligning the alignment pins of the structure to corresponding holes in the circuit board assembly. Aligning the alignment pins may reduce, in horizontal dimensions, mechanical tolerance in a stack comprising the circuit board assembly and the structure. The mechanical tolerance may be in relation to a position of the circuit board assembly within a system used to perform the method.

The method may be performed using a machine that supplies the vacuum pressure. The structure and the circuit board assembly may be at an oblique angle relative to a substantially rectangular surface of the machine. The method may include causing the parts of the circuit board assembly onto which the thermal interface material is dispensed to contact a thermal plate. The method may also include removing the structure from the circuit board assembly. The thermal plate may be or include a cooling plate.

An example system for flattening a circuit board assembly includes a structure having dimensions that enclose a space such that attachment of the circuit board assembly to the structure creates an air-tight seal over the space. The structure has at least one port in fluid communication with the space. The system includes a vacuum source to apply vacuum pressure to the space via the at least one port. The vacuum pressure is of sufficient magnitude and duration to force at least part of the circuit board assembly toward the space. The system also includes a robot to dispense thermal interface material selectively onto parts of the circuit board assembly while the vacuum pressure is applied. The system may include one or more of the following features, either alone or in combination.

The parts of the circuit board assembly may include components on a surface of the circuit board assembly. The robot may be controlled to dispense the thermal interface material onto surfaces of the components. The robot may be controlled not to dispense thermal interface material onto regions of the circuit board assembly that do not include the components.

Absent vacuum, the circuit board assembly bows, at least in part, relative to the structure. The vacuum source may be controlled to apply the vacuum pressure at sufficient magnitude and for sufficient duration to reduce, or to eliminate, bowing of the circuit board assembly relative to the structure. The vacuum source may be controlled to apply the vacuum pressure at sufficient magnitude and for a sufficient duration to cause the circuit board assembly to become flat.

The structure may include a gasket that creates the air-tight seal over the space between the circuit board assembly and the structure. The structure may include ribs within the space. Locations of the ribs may correspond to locations of the circuit board assembly that do not include components. The ribs may be configured to allow fluid communication with the at least one port throughout an entirety of the space. The structure may include alignment pins that are at locations that correspond to locations of holes in the circuit board assembly.

The system may include a machine having a substantially rectangular surface for holding the structure. The machine may include the vacuum source. The structure and the circuit board assembly may be at an oblique angle relative to a substantially rectangular surface of the machine.

Any two or more of the features described in this specification, including in this summary section, may be combined to form implementations not specifically described in this specification.

The systems described herein, or portions thereof, may be control, at least in part, via a computer program product that includes instructions that are stored on one or more non-transitory machine-readable storage media and that are executable on one or more processing devices (e.g., microprocessor(s), application-specified integrated circuit(s), programmed logic such as field programmable gate array(s), or the like). The systems described herein, or portions thereof, may be implemented as one or more apparatus or a method and may include one or more processing devices and computer memory to store executable instructions to implement control of the various functions. The apparatus, systems, method, and/or components described herein may be configured, for example, through design, construction, arrangement, placement, programming, operation, activation, deactivation, and/or control.

The details of one or more implementations are set forth in the accompanying drawings and the following description. Other features and advantages will be apparent from the description and drawings, and from the claims.

DESCRIPTION OF THE DRAWINGS

Like reference numerals in different figures indicate like elements.

DETAILED DESCRIPTION

Described herein are example implementations of systems and processes for flattening a circuit board assembly using vacuum pressure. An example of such a system includes a structure having dimensions that partly enclose a space/volume. Attachment of the circuit board assembly to the structure creates an air-tight seal over the space. The structure includes at least one port in fluid communication with the space. A vacuum source connects to the port(s) to apply vacuum pressure to the space. The vacuum pressure is of sufficient magnitude and duration to force a bowed or bent part of the circuit board assembly toward the space, thereby flattening the circuit board assembly so that all parts of the circuit board assembly are in substantially the same plane. A robot is configured to dispense thermal interface material (TIM) selectively onto parts of the circuit board assembly while the vacuum pressure is applied. The robot is controlled to deposit the TIM on the assumption that the circuit board assembly is flat. Bows or bends in the circuit board assembly could cause the robot to deposit the TIM at the wrong locations on the circuit board assembly. However, because the circuit board assembly has been flattened by the vacuum pressure, there is greater likelihood that the robot will deposit the TIM at the intended locations on the circuit board assembly, thereby potentially reducing manufacturing errors.

Figure 1:
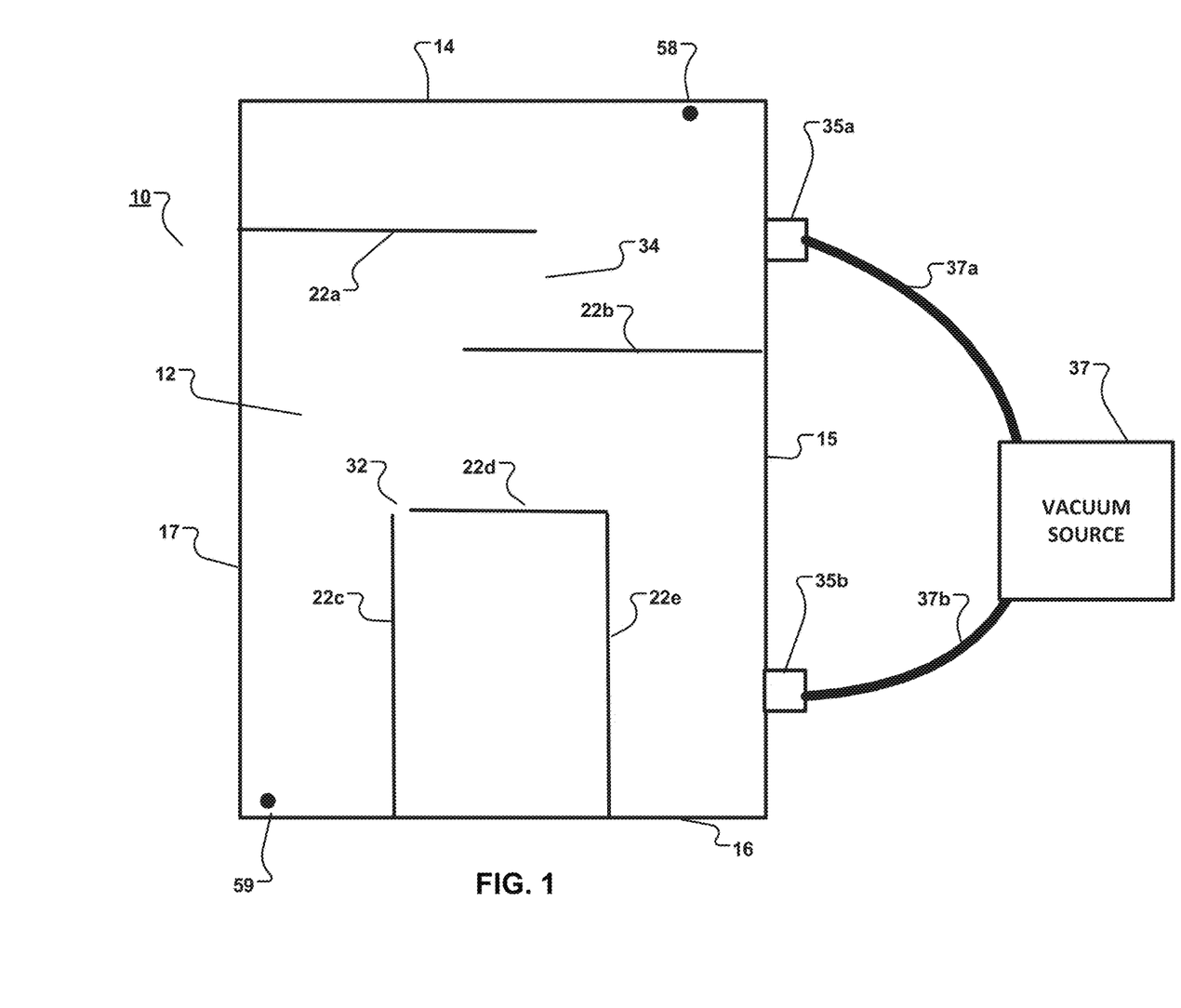
FIG. 1 is a top view of an example structure for use in flattening a circuit board assembly.

FIG. 1 shows a top view example of an example structure 10 of the type described above; and FIG. 2 shows a side perspective view thereof. Structure 10 is rectangular in shape; however, any appropriate shape may be used. For example, structure 10 may be square, trapezoidal, or irregularly shaped. Structure 10 includes bottom surface 12 and sidewalls 14, 15, 16, and 17. Together, surface 12 and sidewalls 14 to 17 partly enclose a volume, or space 20. In the examples described herein, space 20 is enclosed on five sides, with its top open, as shown. As described below, structure 10 is configured—for example, sized and shaped— so that a circuit board assembly, such as a printed circuit board assembly (PCBA), fits over its top 21, thereby enclosing space 20. In some implementations, the opening at the top 21 of structure 10 has the same size (e.g., area) and shape as those of a circuit board assembly that fits over the structure's top.

Figure 2:
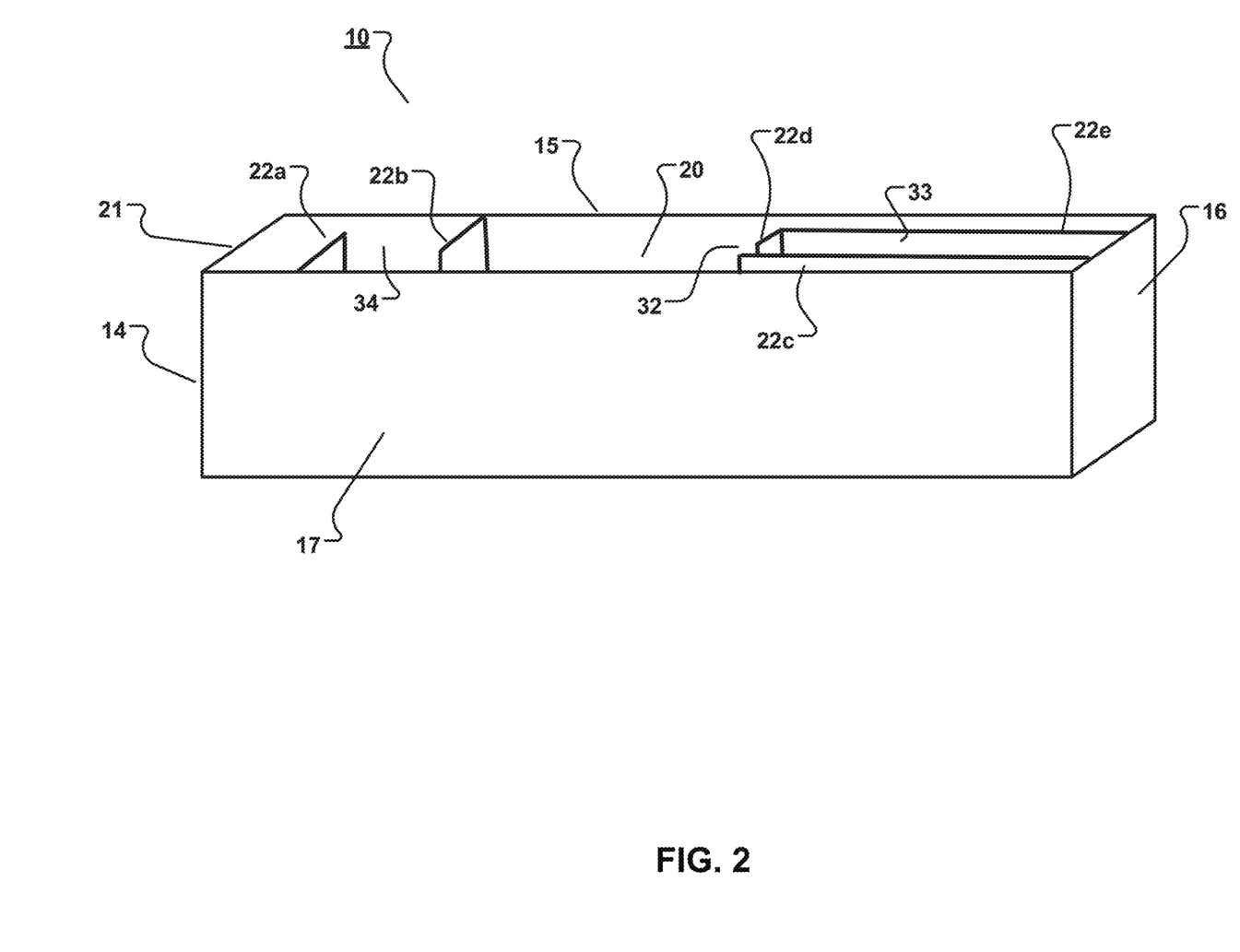
FIG. 2 is a side perspective view of the example structure of FIG. 1.

Structure 10 also includes one or more ribs 22a to 22e within the space. The ribs include walls having a height that is the same as, or substantially the same as, the height of sidewalls 14 to 17. In this context, "substantially the same as" encompasses manufacturing variations or minor irregularities in the height of the ribs and/or sidewalls. The ribs provide stability and support the circuit board assembly. The ribs are located within the space based on the locations of structures contained on the circuit board assembly that fits over the top of structure 10. In an example, the ribs are at locations that correspond to locations on the circuit board assembly that do not include components.

Figure 3:
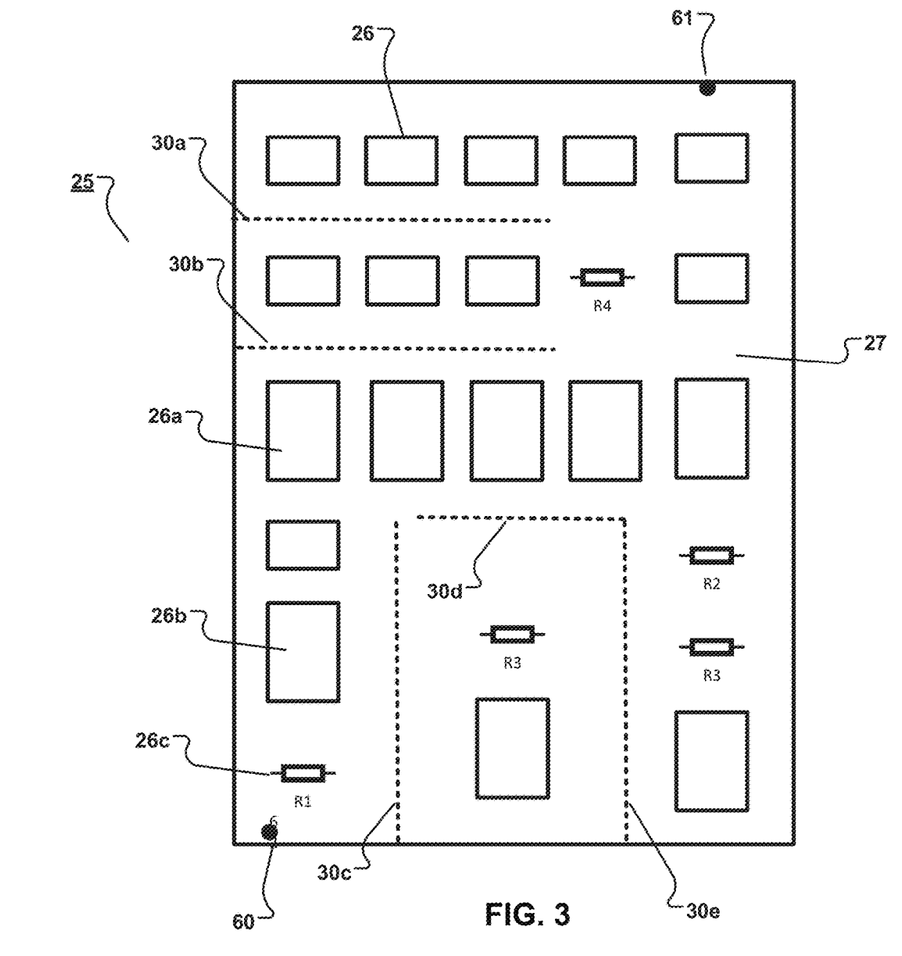
FIG. 3 is a top view of an example circuit board assembly.
Figure 4:
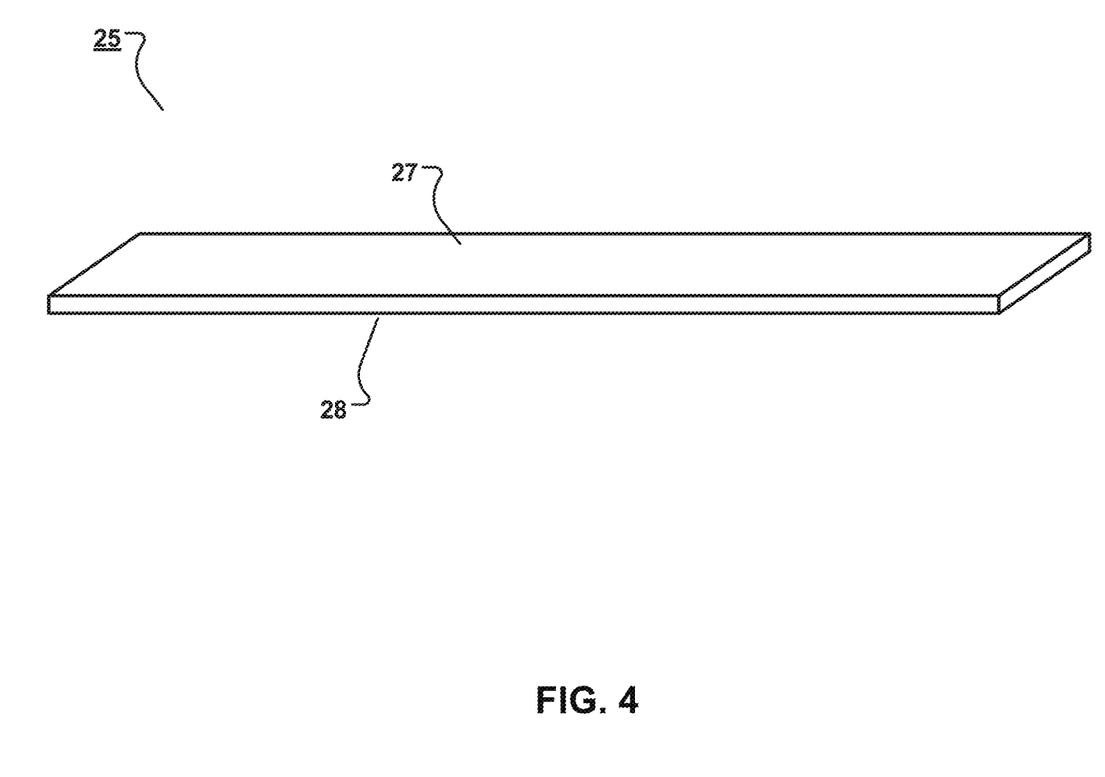
FIG. 4 is a side perspective view of the example circuit board assembly of FIG. 3.

Referring to FIGS. 3 and 4, a circuit board assembly, such as circuit board assembly 25 (FIG. 4 omits the circuit board assembly components), may be comprised of a substrate that holds components and conductive traces and/or layers. The circuit board assembly contains two surfaces, its mounting surface 27 and its bottom 28. The mounting surface 27 is where components 26, such as active and passive electronic devices (e.g., programmable logic 26a, memory 26b, resistor 26c, and other types of components), can be mounted, and electrically connected to, the circuit board assembly. The bottom 28 typically does not include components, although in some implementations the bottom of the circuit board assembly may include components.

The bottom may be where the circuit board assembly connects to another structure, either electrically, mechanically, or both electrically and mechanically. For the example of FIGS. 3 and 4, there are no components on the mounting or bottom surfaces of circuit board assembly 25 that are along locations 30a to 30e, which correspond to ribs 22a to 22e on structure 10. This reduces that chances that the ribs will damage any components when circuit board assembly 25 is attached to structure 10 and when the vacuum source is applied.

Referring back to FIGS. 1 and 2, the ribs are arranged to enable fluid communication throughout an entirety of space 20. That is, the ribs may include holes, openings, or pathways through which air can pass to or from all locations within space 20. In this example, there is an opening 32 between ribs 22c and 22d, through which air may pass to sub-space 33. There is also an opening 34 between ribs 22a and 22b, through which air may pass. In this context, a sub-space includes one or more regions of a space, such as space 20, that is partly enclosed by one or more of the ribs.

Figure 5:
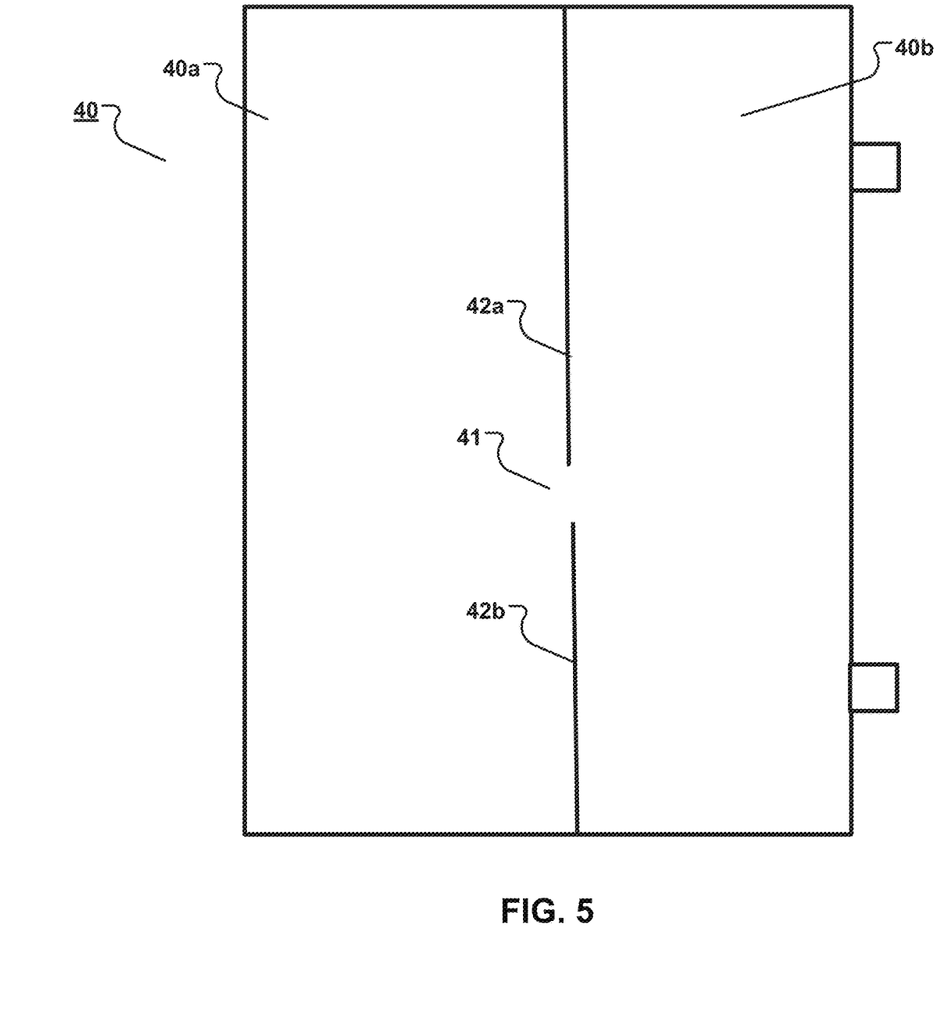
FIG. 5 is a top view of another example structure for use in flattening a circuit board assembly.

FIG. 5 shows another example structure 40, which has the same function as structure 10 but which has a different rib configuration. Here, ribs 42a and 42b include an opening 41, through which air passes between sub-spaces 40a and 40b.

Referring back to FIG. 1, structure 10 includes at least one/one or more air port(s) 35a, 35b in fluid communication with space 20. Air may pass to or from the ports to all regions of space 20. The ports are configured—for example, sized, shaped, and air-tight—to connect to a vacuum source 37, such as a compressor, air pump, or the like, or a component thereof for creating a vacuum to suction air from space 20 or, in some cases, to introduce air into space 20. In an example, vacuum source 37 may include, or connect to, one or more hoses 37a, 37b. The ports 35a, 35b also may be configured to connect to respective hoses 37a, 37b through which pressure, including the vacuum pressure, is applied to space 20.

Figure 6:
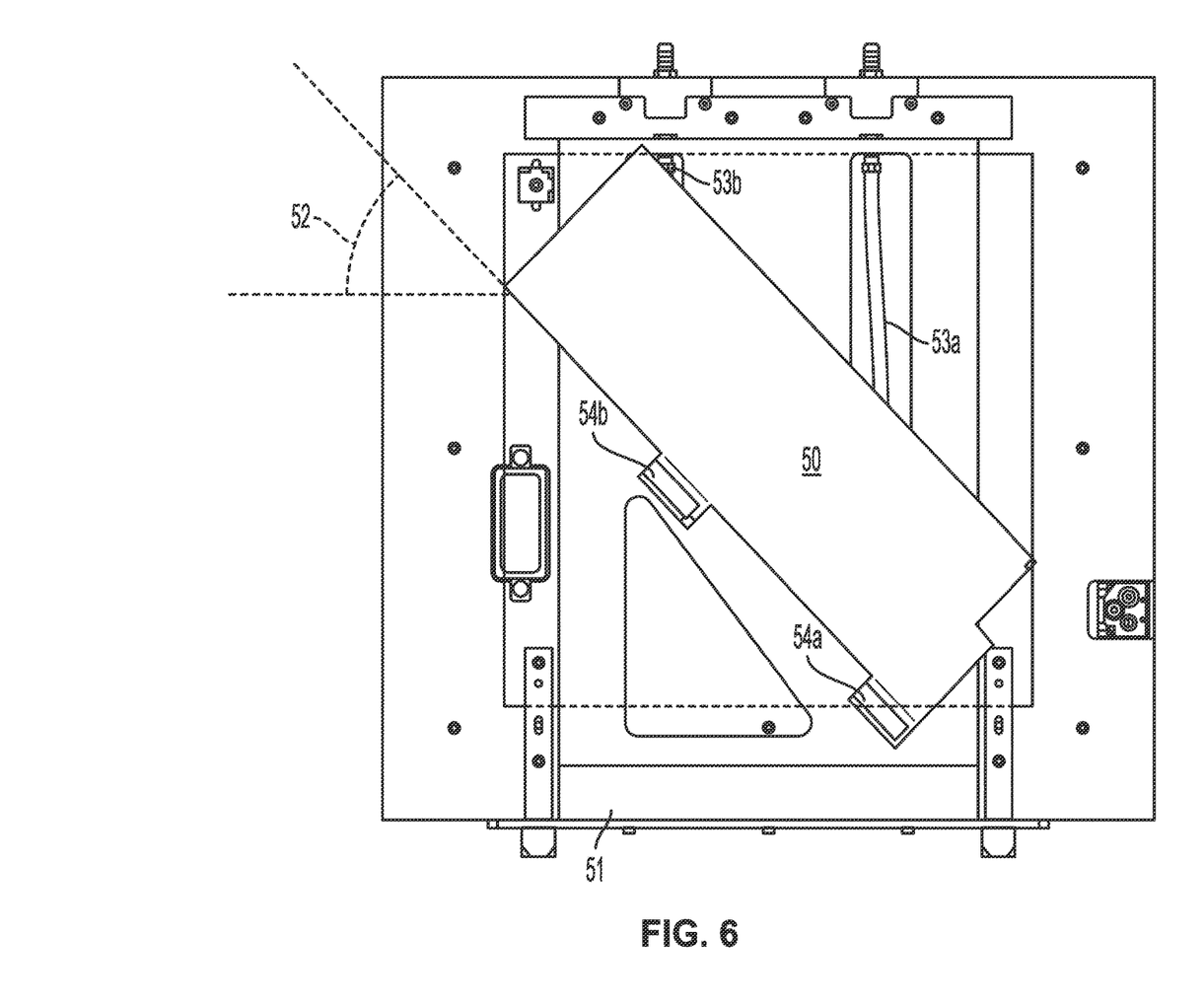
FIG. 6 is a top view of another example structure for use in flattening a circuit board assembly, which is oriented at an oblique angle.

In some implementations, the hoses may be at locations that make connection to the ports difficult or inconvenient. Accordingly, as shown in FIG. 6, a structure 50, which is a variant of structures 10 and 40, may be disposed on a machine 51 having a substantially rectangular surface for holding the structure during processing using the techniques described herein. Machine 51 is connected to, or includes, the vacuum source (not shown). Machine 51 holds the structure (and the circuit board assembly on the structure) at an oblique angle 52 (e.g., an angle that is not a right angle or a multiple of a right angle) relative to a substantially rectangular surface of the machine. Holding the structure at an oblique angle facilitates and enables connection between hoses 53a, 53b and respective ports 54a, 54b on structure 50. That is, in this example, the hoses need not be bent or extended to make the connection the ports on the structure.

Figure 7:
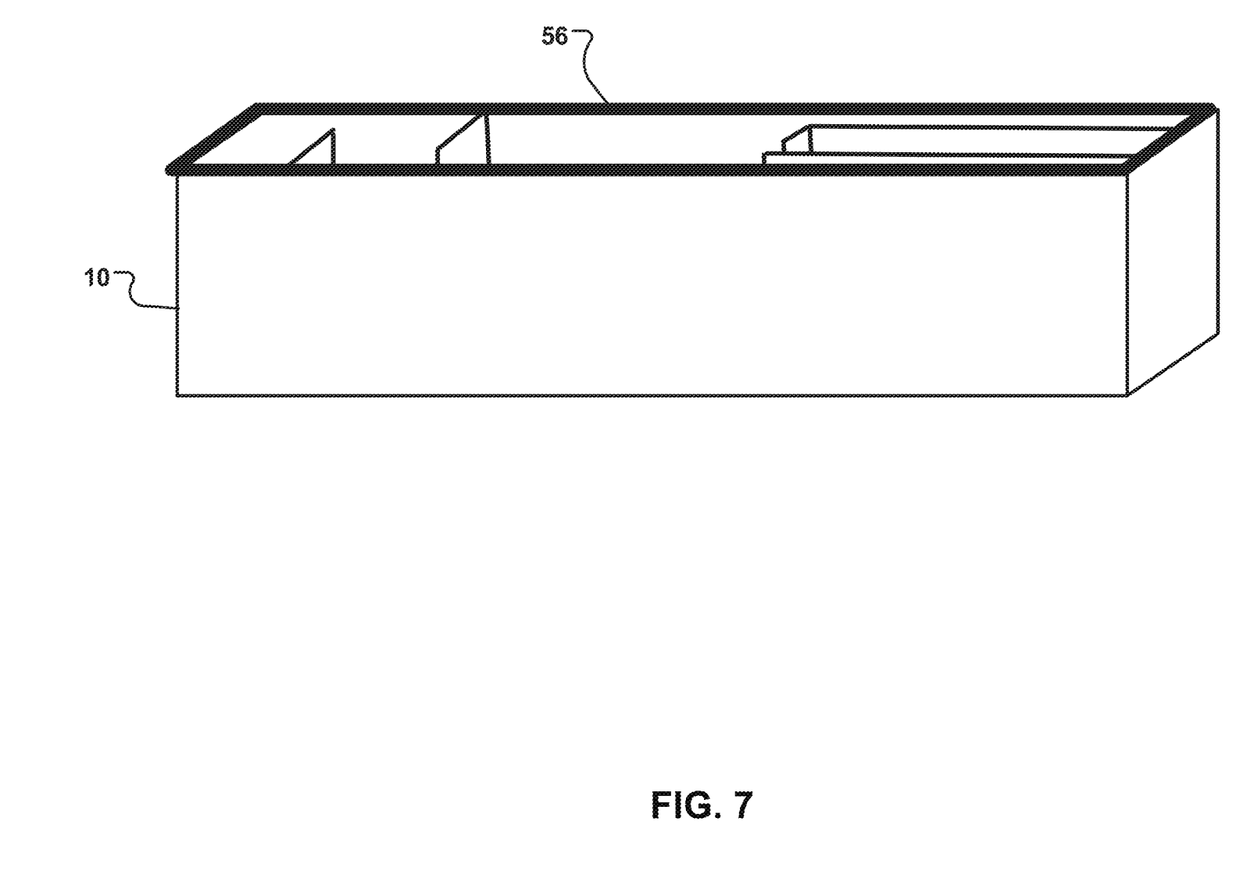
FIG. 7 is a side perspective view of the example structure of FIG. 1 having a gasket mounted thereon.

Referring back to FIGS. 1 and 2, fitting a circuit board assembly on top of structure 10 encloses space 20. When enclosed, space 20 is air-tight and will prevent air from entering or escaping. Space 20 may still be considered air-tight if small amounts of air enter or escape from the space, where those small amounts of air that escape or enter do not prevent or significantly interfere with flattening the circuit board assembly using vacuum pressure as described herein. Referring also to FIG. 7, in some implementations, to improve or promote an air-tight seal between circuit board assembly 25 and structure 10, a gasket 56 may be placed on top of structure 10, along all or part of its outer perimeter. Gasket 56 may be made of rubber, plastic, or other pliable or soft material that enables creation of an air-tight seal between the circuit board assembly, the gasket, and the structure when the circuit board assembly is on the gasket. In some implementations, the gasket may be part of the structure. For the purposes described herein, a circuit board assembly that is "on" the structure may include a circuit board assembly placed directly onto the structure with no gasket or a circuit board assembly placed onto a gasket that is on, or partly of, the structure.

Referring back to FIGS. 1 and 2, structure 10 may also include two or more alignment pins 58 and 59. Alignment pins 58 and 59 align to corresponding holes 61 and 62 (FIG. 3) through circuit board assembly 25. So, when circuit board assembly 25 is fit onto structure 10, the alignment pins 58, 59 fit into respective holes 61, 60, thereby ensuring that circuit board assembly 25 is in a proper or intended placement on structure 10.

Figure 8:
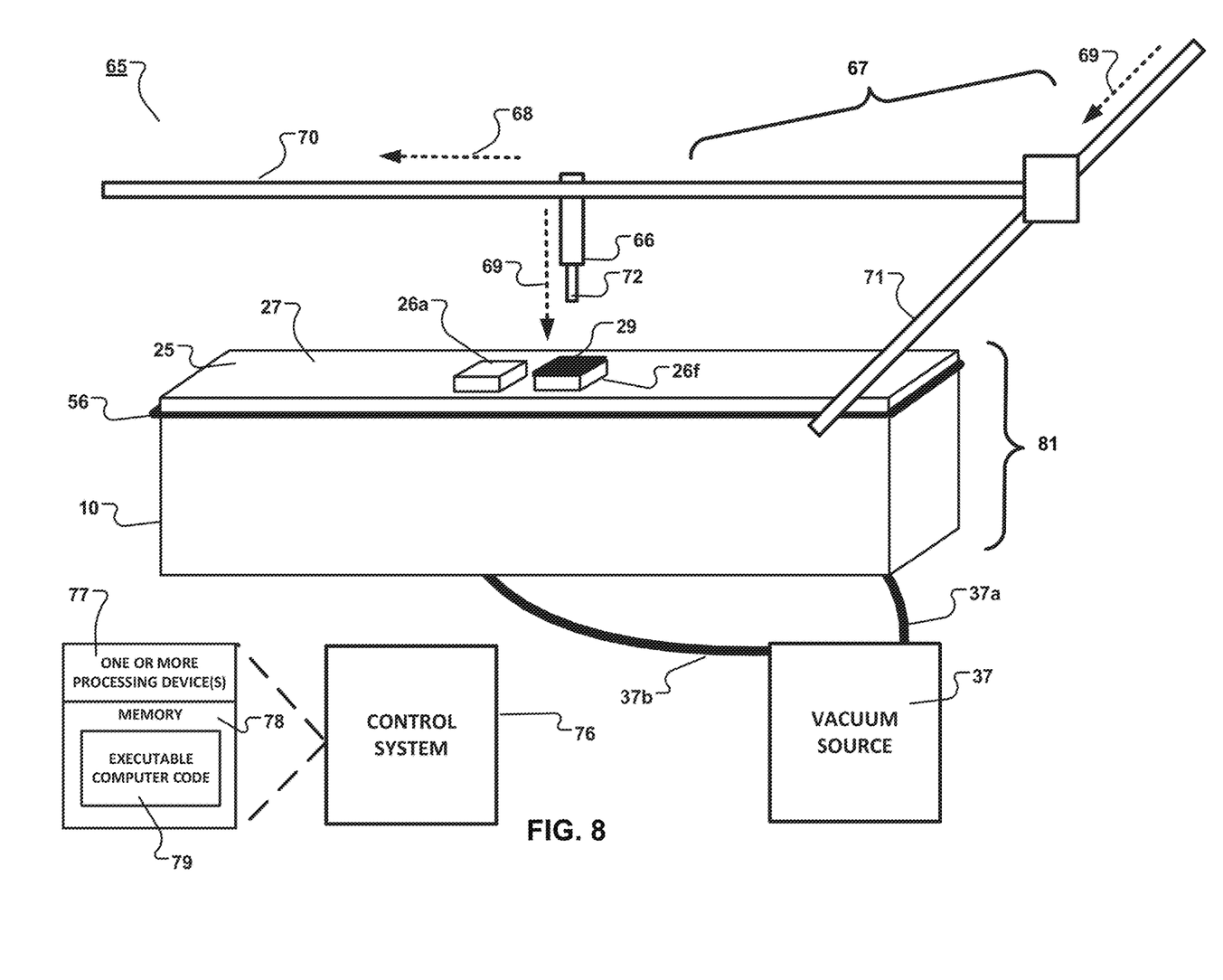
FIG. 8 is a block diagram of a system for flattening a circuit board assembly and for adding thermal interface material to circuit board assembly components.

Referring to FIG. 8, structure 10 is part of a system 65 for manufacturing a device, such as a test instrument, that includes circuit board assembly 25 on structure 10/gasket 56 and that is flattened, at least temporarily, using the techniques described herein. System 65 includes vacuum source 37, such as those described above, to apply vacuum pressure via ports 35a, 35b (FIG. 1) to air-tight space 20 enclosed by structure 10 and circuit board assembly 25. The vacuum pressure is of sufficient magnitude and duration to force the bowed or bent parts of the circuits board toward the space and thereby flatten the circuit board assembly. In an example, the vacuum pressure is above 20 inches of mercury, e.g., 20 to 24 inches of mercury. However, the vacuum pressure is not limited to these values.

System 65 also includes a robot 66, which is mounted on gantry 67 and configured for movement in the X dimension 68, the Y dimension 69, and the Z dimension 70 relative to circuit board assembly 25. For example, robot 66 may be mounted on rail 70 and move in the X dimension 68 along rail 70. Rail 70 may be mounted to rail 71 and move in the Y dimension 69 to also move the robot in the Y dimension. Robot 66 may include an actuator or the like to cause its TIM dispenser 72 to move in the Z dimension closer to a component 26a. Alternatively, robot 66 may be mounted close enough to components on mounting surface 27 so as not to require Z dimension movement. Robot 66 is configured to dispense TIM selectively onto components and/or part(s) of the surface of the circuit board assembly that does not include components while the vacuum pressure is applied. Although one robot is shown, system 65 may include multiple robots for depositing the TIM.

As explained above, mounting surface 27 of circuit board assembly 25 includes components. Some of those components generate heat. Examples of components that generate heat include, but are not limited to, programmable logic such as a field-programmable gate array (FPGA), an application-specific integrated circuit (ASIC), memory such as random access memory (RAM), and resistors. Heat build-up can adversely affect the operation of the circuit board assembly. Accordingly, a thermal plate, such as cold plate 75 (FIG. 9), may be used to conduct heat from the components on the circuit board assembly. The cold plate 75 may be made of metal or other thermally-conductive material and may be temperature controlled, for example, by the control system described herein using a refrigerant or other cooling mechanism, to maintain a certain temperature such as at or below 70° Fahrenheit (° F.), at or below 60° F., at or below 50° F., or lower. The components on the circuit board assembly and/or parts of the circuit board assembly that do not include components (e.g., the board substrate), may be brought into thermal contact with the cold plate, thereby causing heat from the components and/or circuit board assembly to transfer to the cold plate.

Thermal contact between the cold plate and the components and/or parts of the circuit board assembly that do not include components may be implemented by the TIM. That is, all or some of the components and/or parts of the circuit board assembly that do not include components may be in physical contact with a TIM and that TIM may be in physical contact with the cold plate. In some implementations, the TIM may be made from any compliant, thermally conductive and electrically isolating material. For example, the TIM may be, or include, e.g., paraffin wax and/or silicone based materials. The TIM may be deposited onto the components and/or onto parts of the circuit board assembly that do not have components by robot 66 in a semi-solid or gel-like form. The cold plate is then brought into contact with the TIM, thereby creating a thermal path, through the TIM, between the cold plate and the components and/or parts of the board surface containing the TIM. In some implementations, the TIM is allowed to cure or harden prior to contact with the cold plate, resulting in a TIM that is pliable, deformable, and soft enough to create the thermal interface between the cold plate and the components and/or portions of the circuit board assembly containing the TIM.

Robot 66 may be controlled by the control system to move to pre-programmed locations over mounting surface 27 of circuit board assembly 25 and, at each pre-programmed location, to deposit a pre-programmed amount of TIM. The pre-programmed locations may correspond to locations of components, such as 26a, 26f, that generate heat such as those described above and/or locations on the circuit board assembly itself that require thermal control (e.g., cooling). That is, the TIM is applied to the surfaces of such components. The pre-programmed amounts may be based on the area to be covered. For example, larger amounts of TIM may be required for components having larger surface areas; whereas smaller amounts of TIM may be required for components having smaller surface areas. The thickness of the TIM layer that is deposited may be based on the type of the material, the heat at issue, the location where the TIM is deposited, and/or the fragility of the circuit board assembly and/or components. For example, thicker TIM layers may be used for more fragile components to reduce potential damage to those components when the circuit board assembly comes into contact with the cold plate. For example, thicker TIM layers may be used for the parts of the board that do not contain components to enable contact between those TIM layers and the cold plate, since the components have height that could otherwise interfere with such contact. The example of FIG. 8 shows robot 66 having deposited TIM 29 on component 26f before moving on to another component 26a. Note that only two components of circuit board assembly 25 are shown for simplicity. As shown in FIG. 3, for example, circuit board assembly 25 contains more than two components.

As shown in FIG. 8, control system 76 may include one or more processing devices 77, examples of which are described herein. Control system 76 also includes memory 78 storing computer code or instructions 79 that is/are executable by the one or more processing devices to perform at least part of the processes described herein for controlling operation of vacuum source 37, operation of robot 66, and any other appropriate automated functions that are described herein.

Figure 9:
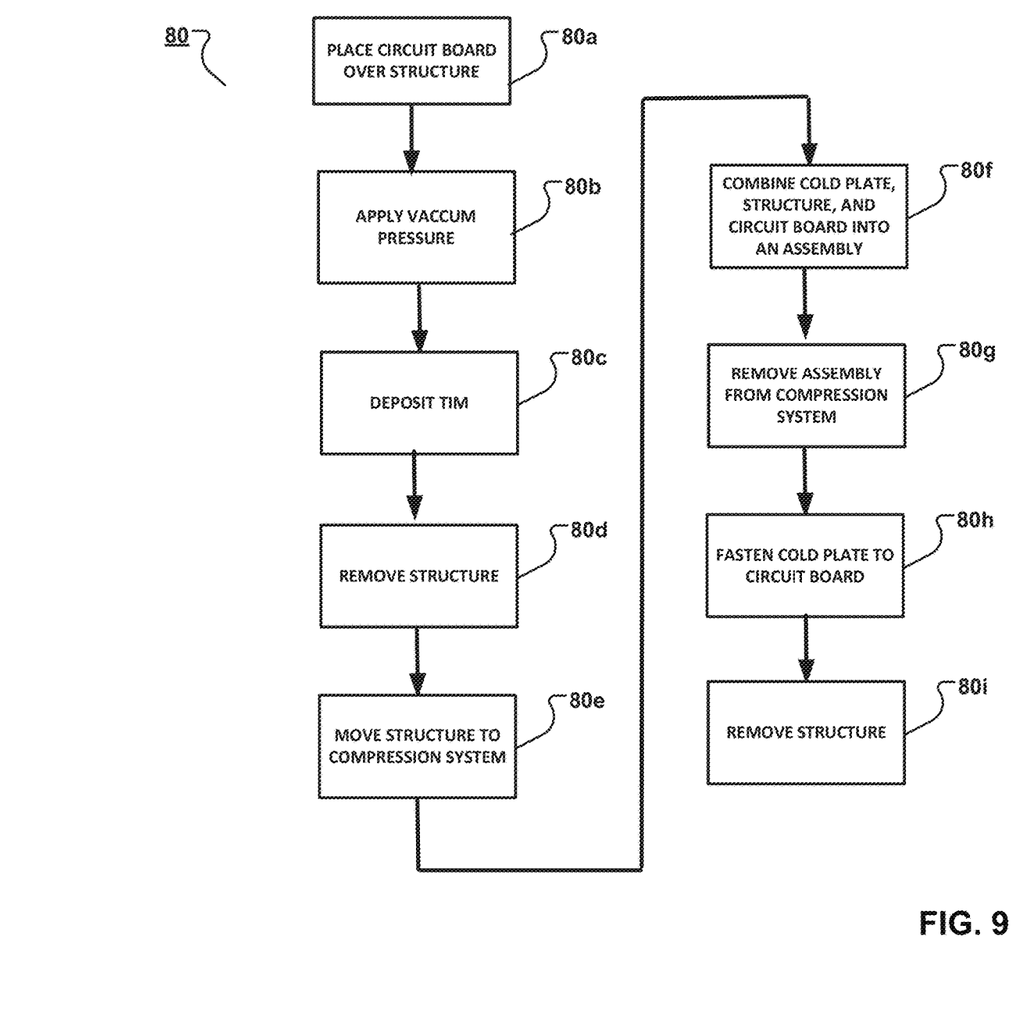
FIG. 9 is a flowchart showing an example process for manufacturing a device, such as test instrument, containing a flattened circuit board assembly.

As noted above, robot 66 is controlled to move over locations over the mounting surface and to deposit the TIM at pre-programmed locations on the surface of the components and/or the circuit board assembly itself. The pre-programmed locations, however, are defined with respect to a flat circuit board assembly; that is, a circuit board assembly having a substrate that is planar or substantially planar in shape (e.g., with no more than 5%, 4%, 3%, 2%, or 1% variation in its planarity/surface height). However, the substrate, and thus the circuit board assembly, may bow or bend, as described above. This may be a result of heat, humidity, or other environmental factors. The bowing or bending may elevate parts of the circuit board assembly and, as a result, affect the locations of the components and/or the parts of the circuit board assembly without components where the TIM is to be deposited. This can lead to errors in depositing the TIM. Accordingly, the techniques described herein and process 80 described below with respect to FIG. 9 are used to flatten the circuit board assembly prior to applying the TIM so that all parts of the circuit board assembly are in substantially the same plane when the TIM is applied by the robot. This flattening may reduce the chances that the robot will deposit the TIM at the wrong locations.

According to process 80, circuit board assembly 25 is placed (80a) over structure 10 and in contact with gasket 56 on structure 10. This configuration is shown in FIG. 8. Placement may be performed manually or automatically (e.g., using robotics—not shown) and may align holes in circuit board assembly 25 to corresponding alignment pins of structure 10. Circuit board assembly 25 is also placed against gasket 56, mounting-side up, using sufficient force to create an air-tight seal, or substantially air-tight seal, between circuit board assembly 25 and the gasket/structure 10.

Either before, during or after placement (80a) of the circuit board assembly, vacuum source 37 is connected to ports 35a, 35b (FIG. 1) on structure 10 via hoses 37a, 37b. The hoses may be part of the structure, the vacuum source, or another machine. In any case, control system 76 controls the vacuum source to apply (80b) vacuum pressure to space 20, which is air-tight and enclosed by circuit board assembly 25. The vacuum pressure is of sufficient magnitude and duration to force or to draw the part(s) of circuit board assembly 25 that is/are bowed or bent toward the space and thereby flatten the circuit board assembly, making the substrate of the circuit board assembly substantially planar. Applying vacuum pressure may reduce, in a vertical dimension, deviations in height of a stack/assembly 81 that includes circuit board assembly 25, gasket 56, and structure 10. The magnitude and duration of the vacuum pressure required to force or to draw the part of the circuit board assembly that is bowed or bent toward the space may depend, for example, on the size of the space, the size of the circuit board assembly, and/or the amount of bowing or bending. In an example, the magnitude of the vacuum pressure is above 20 inches of mercury or 20 to 24 inches of mercury. The duration of the vacuum pressure may be for the entirety of the time that the robot applies the TIM and through when the cooling plate 75 contacts the TIM.

In this regard, following application (80b) of the vacuum pressure to flatten the circuit board assembly and while the vacuum pressure is continually applied, robot 66 is controlled by control system 76 to deposit (80c) the TIM selectively onto surfaces of the components and/or portions of the circuit board assembly that do not contain components. The robot applies the TIM selectively in the sense that the robot applies the TIM to the pre-programmed locations, which may leave parts of the substrate, conductive traces, and/or one or more components TIM-free; that is, with no TIM on them. However, in some cases, all components and the entirety of the circuit board assembly's mounting surface 27 may be covered in TIM.

Figure 10:
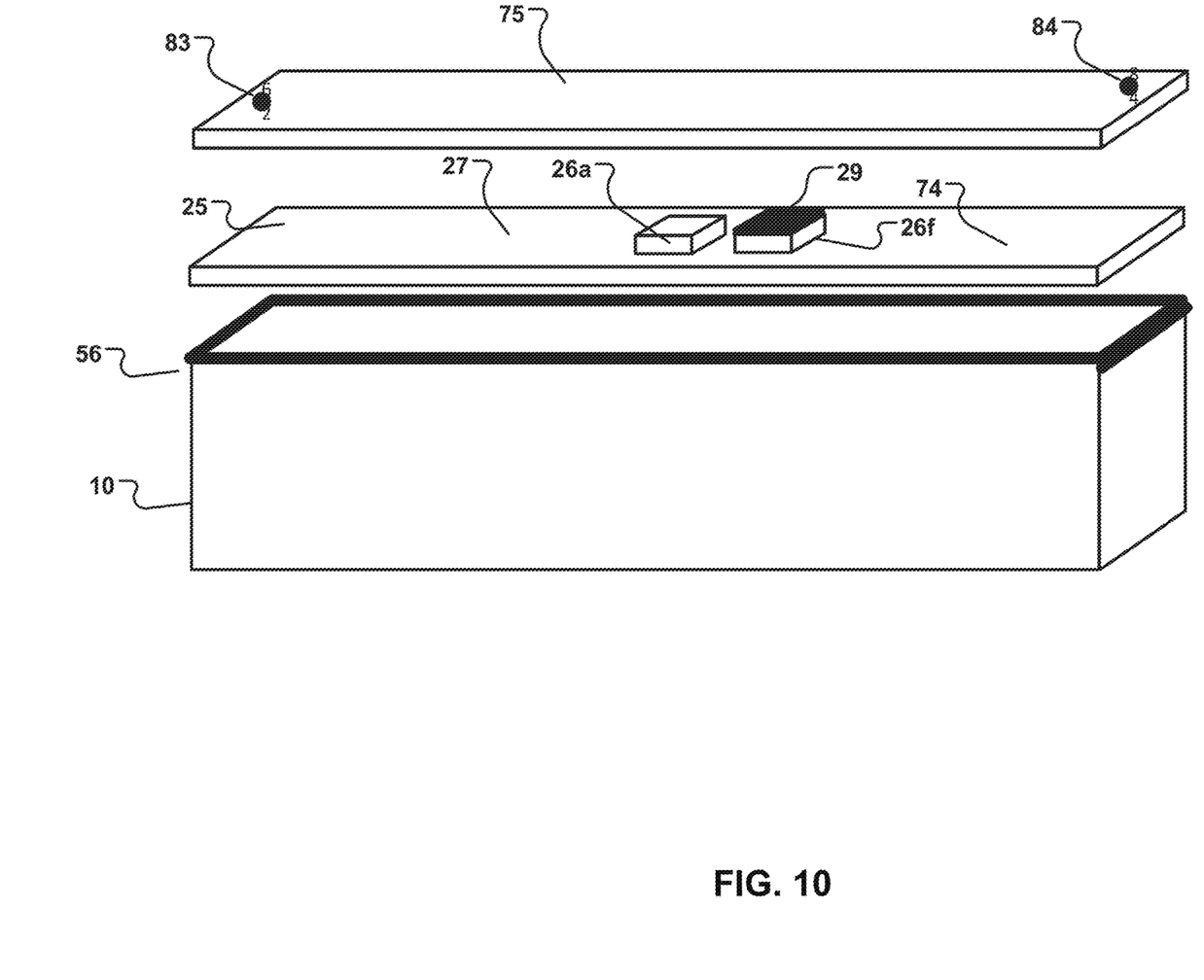
FIG. 10 is a block diagram showing how a cold plate is combined with an assembly containing a circuit board assembly and a structure for flattening the circuit board assembly.
Figure 11:
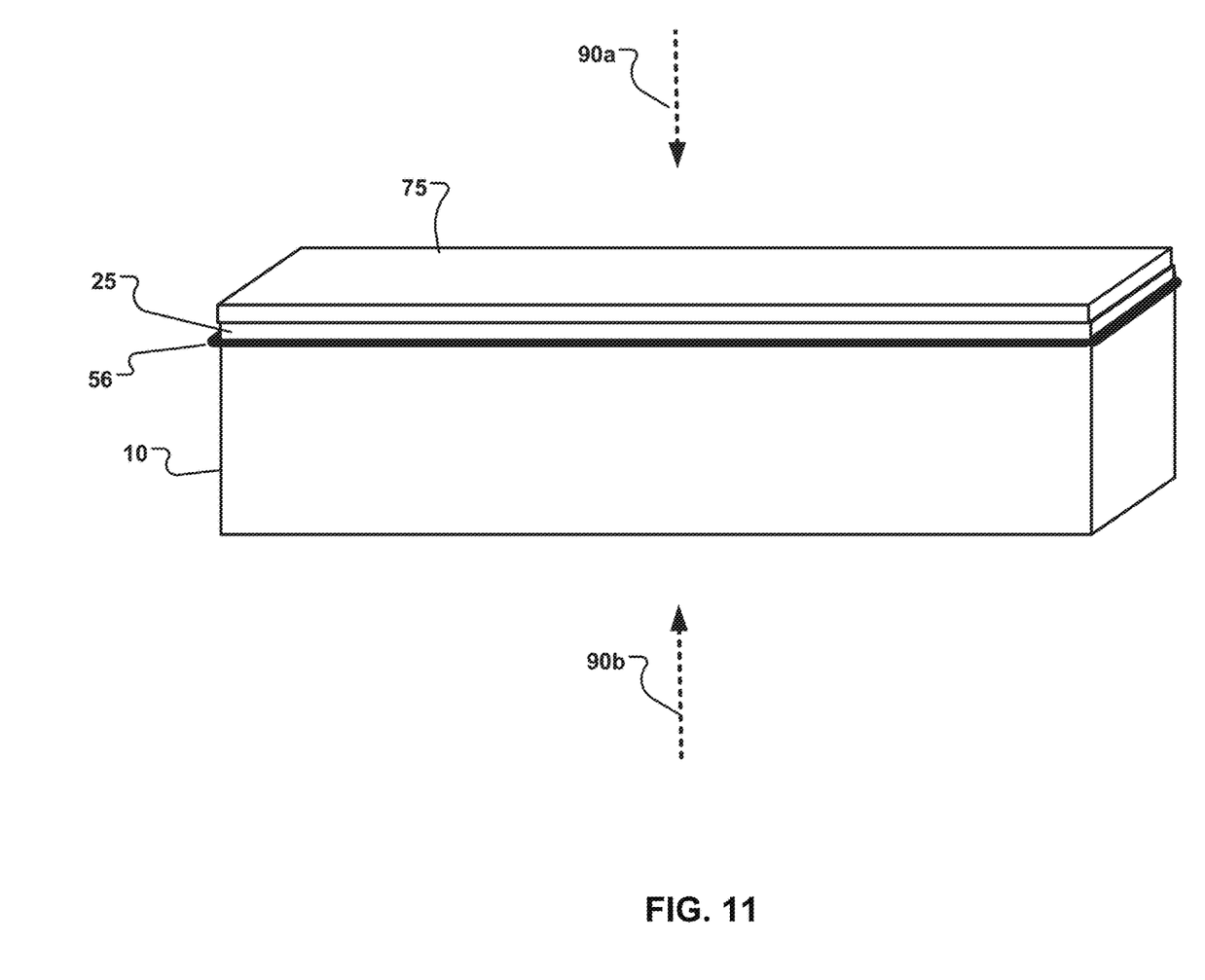
FIG. 11 is a block diagram showing a combination of the cold plate, the assembly containing the circuit board assembly, and the structure for flattening the circuit board assembly.

After all TIM has been applied, the resulting assembly—that is, structure 10, gasket 56, circuit board assembly 25, and TIM 29—is partially deconstructed in that structure 10 is removed (80d). For example, air may be introduced into space 20, e.g., by reversing operation of vacuum source 37 to force structure 10 and circuit board assembly 25 apart or to loosen their connection. Structure 10 may then be removed from the assembly manually or using robotics (not shown). The remainder—circuit board assembly 25 and TIM 29—are then moved, either manually or using robotics (not shown) to a compression system where they are combined (80f) with a structure, which may be structure 10 and gasket 56, and with the a cold plate 75. The combination is implemented without use of vacuum pressure or other fastening mechanisms. For example, referring to FIG. 10, structure 10, gasket 56, circuit board assembly 25 containing TIM 29, and cold plate 75 may be combined by placing them in a stack. The resulting stacked assembly 81, which is shown in FIG. 11, is inserted into a compression mechanism (not shown). The compression mechanism applies force in the direction of arrows 90*a*, 90*b* to force the cold plate into thermal contact with the TIM.

Specifically, the cold plate contacts the TIM on the components and/or on the part of the circuit board assembly not containing the components, thereby creating, via the TIM, a thermal pathway between the cold plate and the components and/or the part of the circuit board assembly not containing the components. The cold plate, the circuit board assembly, and the structure may be brought into contact manually or automatically using robotics (not shown). In some implementations, cold plate 76 may also include holes 83, 84 to align to alignment pins 58, 59 of structure 10 to ensure proper placement of the cold plate. That is, the alignment pins 58, 59 may protrude through holes 61, 60 in circuit board assembly 25 such that they may engage corresponding holes 83, 84 in the cold plate. The amount of pressure applied to bring the cold plate, the circuit board assembly, and the structure into contact may be sufficiently great to enable thermal conduction, via the TIM, between the cold plate and all or part of the circuit board assembly, yet not so great as to damage the circuit board assembly, including the components mounted thereon.

After the assembly and the cold plate are compressed, combined assembly 81 is removed (80*g*) from the compression system, either manually or using robotics (not shown). The circuit board assembly and the cold plate may be fastened (80*h*) together using screws or other type(s) of fastener(s). Thereafter, structure 10, including gasket 56, may be removed (80*i*) from the remainder of the combined assembly. For example, structure 10, including gasket 56, may then be removed from the cold plate/TIM/circuit board assembly manually or using robotics (not shown). The resulting combined circuit board assembly and cold plate, minus structure 10 and gasket 56, may be used in a system, such as a test system. For example, the resulting assembly may be, or be part of, a test instrument for a test system.

An example test instrument is a hardware device configured to send test signals to a DUT. The test signals may include stimuli, such as voltage or current, to elicit reactions in the DUT. The test instrument may also be configured to receive signals from the DUT, including response signals to the test signals, and to analyze those signals from the DUT to determine whether the DUT has passed for failed testing—for example, whether the reactions to the stimuli are what they were expected to be. For example, the test instrument may compare the response signal to one or more predefined thresholds and, based on the comparison, determine whether the DUT has passed for failed testing. Examples of types of test instruments that may use the resulting assembly include, but are not limited to, a radio frequency (RF) test instrument, a digital test instrument, and a parametric test instrument.

An example test system may include multiple test instruments (e.g., one, two, three, four, or more), which may be configured to perform one or more types of testing, such as RF testing, digital testing, parametric testing, or the like. The test system also includes a control system, which may be part of, or distributed across, one or more test instruments or separate from the test instruments. The control system may include one or more processing devices, examples of which are described herein. The control system includes memory storing computer code or instructions that is/are executable by the one or more processing devices to control testing by executing one or more test programs and sending instructions to one or more of the test instruments.

All or part of the systems and processes described in this specification and their various modifications may be configured or controlled at least in part by one or more computers such as control system 76 using one or more computer programs tangibly embodied in one or more information carriers, such as in one or more non-transitory machine-readable storage media. A computer program can be written in any form of programming language, including compiled or interpreted languages, and it can be deployed in any form, including as a stand-alone program or as a module, part, subroutine, or other unit suitable for use in a computing environment. A computer program can be deployed to be executed on one computer or on multiple computers at one site or distributed across multiple sites and interconnected by a network.

Actions associated with configuring or controlling the test system and processes described herein can be performed by one or more programmable processors executing one or more computer programs to control or to perform all or some of the operations described herein. All or part of the test systems and processes can be configured or controlled by special purpose logic circuitry, such as, an FPGA (field programmable gate array) and/or an ASIC (application-specific integrated circuit) or embedded microprocessor(s) localized to the instrument hardware.

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, such as magnetic, magneto-optical disks, or optical disks. Non-transitory machine-readable storage media suitable for embodying computer program instructions and data include all forms of non-volatile storage area, including by way of example, semiconductor storage area devices, such as EPROM (erasable programmable read-only memory), EEPROM (electrically erasable programmable read-only memory), and flash storage area devices; magnetic disks, such as internal hard disks or removable disks; magneto-optical disks; and CD-ROM (compact disc read-only memory) and DVD-ROM (digital versatile disc read-only memory).

Elements of different implementations described may be combined to form other implementations not specifically set forth previously. Elements may be left out of the systems described previously without adversely affecting their operation or the operation of the system in general. Furthermore, various separate elements may be combined into one or more individual elements to perform the functions described in this specification.

Other implementations not specifically described in this specification are also within the scope of the following claims.

What is claimed is:

1. A system comprising: a structure having a bottom surface and sidewalls that enclose a space such that attachment of a circuit board assembly to a top of the structure creates an air-tight seal over the space, the structure having at least one port configured to allow air to pass from the space, wherein the structure comprises one or more ribs within the space enclosed by the sidewalls and the bottom surface, where locations of the one or more ribs within the space correspond to locations of the circuit board assembly that do not include components, and where the one or more ribs comprise walls that have a height that reaches a height of the sidewalls of the structure;

a vacuum source to apply vacuum pressure to the space via the at least one port, the vacuum pressure being of sufficient magnitude and duration to force at least part of the circuit board assembly toward the space; and a robot to dispense thermal interface material selectively onto parts of the circuit board assembly while the vacuum pressure is applied.

2. The system of claim 1, wherein the parts of the circuit board assembly comprise components on a surface of the circuit board assembly; and wherein the robot is configured to dispense the thermal interface material onto surfaces of the components.

3. The system of claim 1, wherein the robot is configured not to dispense thermal interface material onto regions of the circuit board assembly that do not include the components.

4. The system of claim 1, wherein, in the absence of vacuum, the circuit board assembly bows, at least in part, relative to the structure; and wherein the vacuum source is configured to apply the vacuum pressure at sufficient magnitude and for sufficient duration to reduce, or to eliminate, bowing of the circuit board assembly relative to the structure.

5. The system of claim 4, wherein the vacuum source is configured to apply the vacuum pressure at sufficient magnitude and for a sufficient duration to cause the circuit board assembly to become flat and to contact the one or more ribs.

6. The system of claim 1, wherein the structure comprises a gasket that supports the air-tight seal over the space between the circuit board assembly and the structure.

7. The system of claim 1, wherein the ribs comprise holes, openings, or pathways through which air can pass between locations within the space and the at least one port.

8. The system of claim 1, wherein the structure comprises alignment pins that are at locations that correspond to locations of holes in the circuit board assembly.

9. The system of claim 1, further comprising: a machine having a rectangular surface for holding the structure, the machine comprising the vacuum source;

wherein the structure and the circuit board assembly are at an oblique angle relative to the rectangular surface of the machine.

10. The system of claim 1, wherein the one or more ribs are configured to create sub-spaces within the space and are configured to allow air to pass between the sub-spaces.

11. The system of claim 1, wherein the robot is configured for at least two-dimensional movement relative to the circuit board assembly.

12. A method performed using the system of claim 1, the method comprising:

controlling the vacuum source to apply the vacuum pressure to the space via the at least one port, the vacuum pressure forcing the at least part of the circuit board assembly toward the space; and controlling the robot to dispense the thermal interface material selectively onto the parts of the circuit board assembly while the vacuum pressure is applied.

13. The method of claim 12, wherein the parts of the circuit board assembly comprise components on a surface of the circuit board assembly; and wherein the thermal interface material is dispensed onto surfaces of the components.

14. The method of claim 12, wherein applying vacuum pressure reduces, in a vertical dimension, deviations in height of a stack comprising the circuit board assembly and the structure and brings the circuit board assembly into contact with the one or more ribs.

15. The method of claim 13, wherein the thermal interface material is not dispensed onto regions of the circuit board assembly that do not include the components.

16. The method of claim 12, wherein, in the absence of vacuum, the circuit board assembly bows, at least in part, relative to the structure; and wherein the vacuum pressure is applied at sufficient magnitude and for a sufficient duration to reduce, or to eliminate, bowing of the circuit board assembly relative to the structure.

17. The method of claim 16, wherein the vacuum pressure is applied at sufficient magnitude and for a sufficient duration to cause the circuit board assembly to become flat.

18. The method of claim 12, wherein the structure comprises a gasket that supports the air-tight seal over the space between the circuit board assembly and the structure.

19. The method of claim 12, wherein the structure comprises alignment pins; and wherein attaching the circuit board assembly to the structure comprises aligning the alignment pins of the structure to corresponding holes in the circuit board assembly.

20. The method of claim 19, wherein aligning the alignment pins reduces, in horizontal dimensions, mechanical tolerance in a stack comprising the circuit board assembly and the structure, the mechanical tolerance being in relation to a position of the circuit board assembly within the system.

21. The method of claim 12, wherein the vacuum source is associated with a machine that supplies the vacuum pressure; and wherein the structure and the circuit board assembly are at an oblique angle relative to a rectangular surface of the machine.

22. The method of claim 12, further comprising:

causing the parts of the circuit board assembly onto which the thermal interface material is dispensed to contact a thermal plate; and removing the circuit board assembly from the structure.

23. The method of claim 22, wherein the thermal plate comprises a cooling plate.

* * * * *